United States Patent
Lee

(10) Patent No.: US 7,273,781 B2
(45) Date of Patent: Sep. 25, 2007

(54) METHOD OF FORMING A CAPACITOR IN A SEMICONDUCTOR DEVICE WITHOUT WET ETCHANT DAMAGE TO THE CAPACITOR PARTS

(75) Inventor: Kee Jeung Lee, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 129 days.

(21) Appl. No.: 11/254,261

(22) Filed: Oct. 20, 2005

(65) Prior Publication Data

US 2007/0042540 A1    Feb. 22, 2007

(30) Foreign Application Priority Data

Aug. 18, 2005  (KR)  .................... 10-2005-0075790

(51) Int. Cl.
*H01L 21/8242* (2006.01)
(52) U.S. Cl. ................ 438/253; 438/396; 257/E21.648
(58) Field of Classification Search ............... 438/3, 438/238, 253–256, 396–399; 257/E21.648
See application file for complete search history.

(56) References Cited

U.S. PATENT DOCUMENTS 6,884,678 B2 *   4/2005   Park et al. ................ 438/254

FOREIGN PATENT DOCUMENTS

KR   1020030038831   5/2003
KR   1020030067821   8/2003

OTHER PUBLICATIONS

Korean Patent Gazette from Korean Patent Office. Publication date: Jun. 15, 2007.

* cited by examiner

*Primary Examiner*—H. Jey Tsai
(74) *Attorney, Agent, or Firm*—Ladas & Parry LLP

(57) ABSTRACT

To form a capacitor in a semiconductor device, an etching barrier layer and a mold insulating layer are sequentially formed on an interlayer insulating film having a contact plug. A hole exposing the contact plug is formed by etching the mold insulating layer and the etching barrier layer. A first blocking layer having a wet etching rate lower than that of the mold insulating layer is formed on the hole sidewall. A storage electrode and a second blocking layer made from the identical material of the first blocking layer are formed on the resultant structure. The predetermined portions of the second blocking layer and the metal layer formed on the mold insulating layer are removed. A cylinder type storage electrode is formed by wet etching the mold insulating layer. A dielectric layer is formed on the cylinder type storage electrode. A plate electrode is formed on the dielectric layer.

20 Claims, 5 Drawing Sheets

METHOD OF FORMING A CAPACITOR IN A SEMICONDUCTOR DEVICE WITHOUT WET ETCHANT DAMAGE TO THE CAPACITOR PARTS

BACKGROUND OF THE INVENTION

1. Field of the invention

The present invention relates to a method of forming a capacitor in a semiconductor device. More particularly, the present invention relates to a method of forming a capacitor in a semiconductor device capable of preventing contact plug damage and interlayer insulating film loss aligned below a storage electrode due to penetration of etchant when a TiN layer or a Ru layer is used as a storage electrode material.

2. Description of the Prior Art

Due to the rapid advancement of the semiconductor technologies, the semiconductor memories recently produced are more likely to be highly integrated to reduce the unit cell area and to lower the operational voltage of the semiconductor devices. However, even when the cell area is reduced, a sufficient capacitance above 25 fF/cell is required for a memory device in order to prevent the refresh time from being shortened without soft error.

Under the above circumstance, an SIS (silicon-insulator-silicon) capacitor employing a dielectric layer made from $Al_2O_3$ presents limitations for ensuring the capacitance required for next-generation DRAMs above 512M. For this reason, an MIS (metal-insulator-silicon) capacitor employing a TiN electrode and a dielectric layer made from $HfO_2/Al_2O_3$ has been extensively developed.

In such an MIS capacitor, Tox (equivalent oxide thickness) may be limited to 12 Å. For this reason, if a metal wiring less than 70 nm is applied to the DRAMs, an effective area of a storage electrode may not exceed 0.85 $\mu m^2$/cell even if a concave type storage electrode is employed, so that it is difficult to obtain the cell capacitance above 25 fF/cell.

Therefore, if a fine wiring less than 70 nm is applied to the DRAMs, it is essentially necessary to replace the concave type storage electrode with a cylinder type storage electrode to enlarge the effective area of the storage electrode for achieving the cell capacitance above 25 fF/cell. In addition, a cylinder type TIT (TiN-insulator-TiN) or RiT (Ru-insulator-TiN) capacitor employing a dielectric layer having a dielectric constant higher than that of currently used $HfO_2/Al_2O_3$ or $HfO_2/Al_2O_3/HfO_2$ is necessary in order to obtain higher capacitance for the DRAMs.

However, if the cylinder type capacitor is fabricated by using the TiN layer or the Ru layer as a storage electrode material, following problems may occur.

In general, when the cylinder type capacitor is fabricated, a cylinder type storage electrode is first formed and then a wet etching process is carried out by using wet-etch chemical, such as diluted HF solution or BOE ($NHF_4+HF$) solution, in order to remove a mold insulating layer.

However, as shown in FIG. 1, if the TiN layer or the Ru layer is used as the storage electrode material, the wet-etch chemical may penetrate into an interlayer insulating film 11 during the wet etching process through a path A formed in the storage electrode 15 and a path B formed at an interfacial surface between the storage electrode 15 and an etching barrier layer 14 made from a silicon nitride layer so that a polysilicon contact plug 12 and the interlayer insulating film 11 aligned below the storage electrode 15 may be damaged. Reference numeral 13 represents a diffusion barrier layer made from $TiSi_2$.

FIG. 2 is a TEM photograph representing a diffusion barrier layer made from $TiSi_2$, a polysilicon contact plug and an interlayer insulating film which are damaged by wet-etch chemical when the wet etching process is performed for removing a mold insulating layer.

Such a defect leads to an electric connection error causing malfunction of DRAMs and reduces a yield rate of semiconductor devices because the defect may occur over the whole area of a wafer, so that it is necessary to remove the defect.

SUMMARY OF THE INVENTION

Accordingly, the present invention has been made to solve the above-mentioned problems occurring in the prior art, and an object of the present invention is to provide a method of forming a capacitor in a semiconductor device capable of preventing a contact plug damage and an interlayer insulating film loss due to wet-etch chemical penetration when a TiN layer or a Ru layer is used as a storage electrode material.

Another objective of the present invention is to provide a method of forming a capacitor in a semiconductor device with improved yield rate and reliability by preventing a contact plug damage and an interlayer insulating film loss due to wet-etch chemical penetration through the capacitor storage electrode.

In order to accomplish the above and other objectives, according to the present invention, there is provided a method for forming a capacitor of a semiconductor device, the method comprising the steps of: sequentially forming an etching barrier layer and a mold insulating layer on an interlayer insulating film having a contact plug; forming a hole exposing the contact plug by etching the mold insulating layer and the etching barrier layer; forming a first blocking layer on a sidewall of the hole, the first blocking layer being made from a material having a wet etching rate lower than that of the mold insulating layer; sequentially forming a metal layer for a storage electrode and a second blocking layer made from a material identical to that of the first blocking layer on a resultant substrate; removing predetermined portions of the second blocking layer and the metal layer formed on the mold insulating layer; forming a cylinder type storage electrode by removing the mold insulating layer through a wet etching process; forming a dielectric layer on the cylinder type storage electrode; and forming a plate electrode on the dielectric layer.

According to the preferred embodiment of the present invention, the etching barrier layer is made from a silicon nitride layer.

The mold insulating layer is made from an oxide layer including one selected from the group consisting of TEOS, PSG, BPSG and USG or a stacked layer thereof.

The mold insulating layer is etched by using the etching barrier layer as an etch stop layer and the etching barrier layer is etched with an over etching target in a range of 10 to 100%.

Either one of the first and second blocking layers is made from a dielectric layer selected from the group consisting of $Al_2O_3$, $HfO_2$, $TiO_2$, $Ta_2O_5$, $ZrO_2$ and $La_2O_3$ layers. The first blocking layer has a thickness of about 10 to 100 Å and the second blocking layer has a thickness of about 10 to 200 Å.

After the first blocking layer has been formed and before the second blocking layer is formed, metal silicide is formed on a surface of the contact plug.

The wet etching process for the mold insulating layer is performed by using an HF solution or a BOE solution. A part of the first blocking layer remains between the etching barrier layer and the storage electrode when the mold insulating layer is wet-etched and the second blocking layer is completely removed when the mold insulating layer is wet-etched.

The dielectric layer is a stacked layer consisting of an $HfO_2$ layer and an $M_xO_y$ layer, which is formed on the $HfO_2$ layer and includes one selected from the group consisting of $TiO_2$, $Ta_2O_5$, $ZrO_2$ and $La_2O_3$. The $HfO_2$ layer has a thickness of about 10 to 50 Å and the $M_xO_y$ layer has a thickness of about 10 to 100 Å.

The $HfO_2$ layer and the $M_xO_y$ layer are formed through repeatedly performing an ALD (atomic layer deposition) process in a deposition cycle of source gas flow, purge, reaction gas flow and purge until a desire thickness is obtained.

The plate electrode includes a TiN layer or a Ru layer. The plate electrode consists of a TiN layer and a W-layer or a WN-layer deposited on the TiN layer.

The method further comprises a step of forming a protective layer after forming the plate electrode for ensuring structural stability of the capacitor.

The protective layer is made from a dielectric layer selected from the group consisting of $Al_2O_3$, $HfO_2$, $TiO_2$, $Ta_2O_5$, $ZrO_2$ and $La_2O_3$ layers or is made from a TiN metal layer.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, the present invention will be described with reference to accompanying drawings.

First, the technical principle of the present invention will be described. According to the present invention, a contact plug and an interlayer insulating film aligned below a storage electrode are prevented from being damaged or broken when a wet etching process is performed to remove a mold insulating layer by using an etching selectivity. That is, according to the present invention, a dielectric layer, such as $Al_2O_3$, $HfO_2$, $TiO_2$, $Ta_2O_5$, $ZrO_2$ or $La_2O_3$, having a shallow thickness and a wet etching rate lower than that of an oxide layer used as a mold insulating layer, such as TEOS, PSG, BPSG or USG, is deposited after/before depositing a TiN layer or a Ru layer as a storage electrode material, thereby preventing or restricting penetration of the wet-etch chemical when the wet etching process is performed to remove a mold insulating layer. Thus, the contact plug and the interlayer insulating film aligned below the storage electrode can be prevented from being damaged or loss.

In addition, the present invention employs a dual layer of $M_xO_y/HfO_2$ as a dielectric layer. Since the dual layer has a dielectric constant higher than that of $HfO_2/Al_2O_3$ or $HfO_2/Al_2O_3/HfO_2$, which is currently used as a dielectric layer, Tox (equivalent oxide thickness) can be reduced below 12 Å, so that the capacitor may have sufficient cell capacitance of above 25 fF/cell even in a 60 nm level. The $M_xO_y$ layer has a dielectric constant higher than the dielectric constant ($\epsilon$=9) of $Al_2O_3$ and includes one selected from the group consisting of $TiO_2$ ($\epsilon$=40), $Ta_2O_5$ ($\epsilon$=25), $ZrO_2$ ($\epsilon$=25) and $La_2O_3$ ($\epsilon$=30).

Hereinafter, the procedure for forming the capacitor according to one embodiment of the present invention will be described with reference to FIGS. 3A to 3G.

Figure 1:
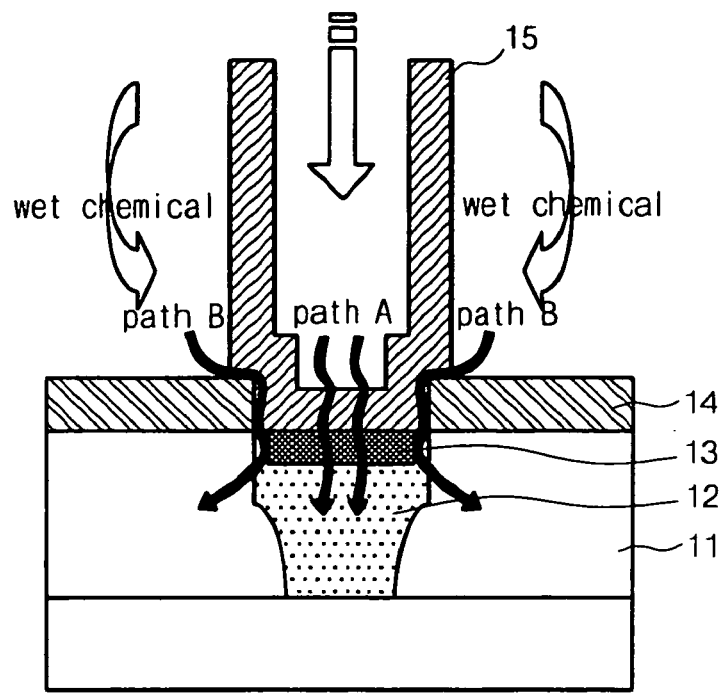
FIG. 1 is a sectional view for illustrating problems of a prior art.
Figure 2:
FIG. 2 is a TEM photograph representing a polysilicon contact plug and an interlayer insulating film which are damaged by wet-etch chemical penetration through a capacitor storage electrode.
Figure 3A:
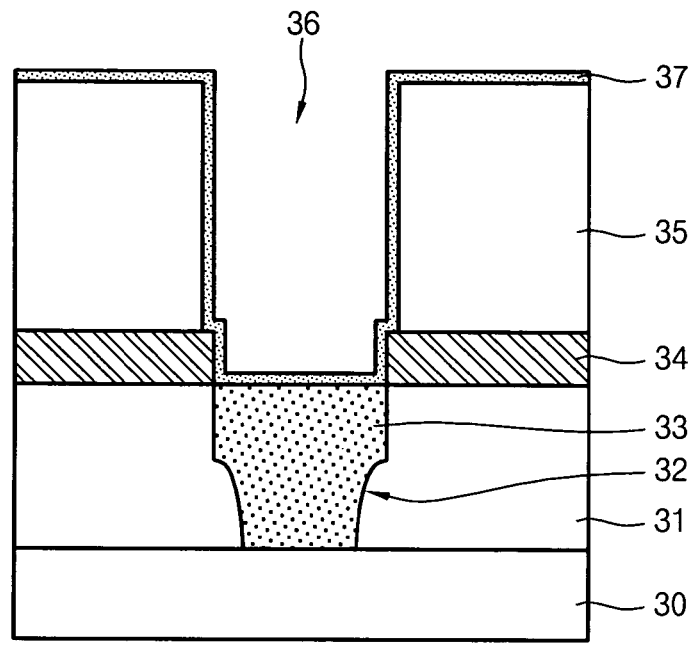
FIGS. 3A to 3G are sectional views illustrating the procedure for forming a capacitor according to one embodiment of the present invention.

Referring to FIG. 3A, a semiconductor substrate 30 formed with a predetermined lower pattern (not shown) including a transistor and a bit line is prepared. After that, an interlayer insulating film 31 is formed on an entire surface of the semiconductor substrate 30 such that the lower pattern is covered with the interlayer insulating film 31. Then, the interlayer insulating film 31 is etched, thereby forming a contact hole 32 for exposing the lower pattern. Although it is not illustrated in detail, the contact hole 32 may expose a landing plug poly formed in a source area of the transistor.

After that, a polysilicon layer is deposited on the interlayer insulating film 31 such that the contact hole 32 is filled with the polysilicon layer and then the polysilicon layer is subject to an etch back process or a CMP (chemical mechanical polishing) process so as to form a polysilicon contact plug 33. Then, an etching barrier layer 34 made from a silicon nitride layer is formed on the interlayer insulating film 31 including the contact plug 33 and a mold insulating layer 35 is deposited on the etching barrier layer 34 in order to obtain a cylinder type storage electrode structure.

For example, the polysilicon contact plug 33 has a phosphorous concentration above 1E20 ion/$cm^3$. The mold insulating layer 35 is made from an oxide layer including one selected from the group consisting of TEOS, PSG, BPSG and USG or a stacked layer thereof. The etching barrier layer 34 made from the silicon nitride layer is formed with a thickness of about 200 to 800 Å by using LPCVD, PECVD or RTP equipment.

After that, the mold insulating layer 35 is etched by using the etching barrier layer 34 and then a hole 36 exposing the contact plug 33 and defining a storage electrode area is formed by etching the etching barrier layer 34. The mold insulating layer 35 is etched by using the etching barrier layer 34 formed below the mold insulating layer 35 as an etch stop layer. At this time, an etching selectivity between the oxide layer and the nitride layer is in a range of about 5 to 20:1. The etching process for the etching barrier layer 34 is carried out after the mold insulating layer 35 has been etched while setting an over etching target in a range of 10 to 100%.

Thereafter, a first blocking layer 37 is formed on a resultant structure including the exposed contact plug 33 in order to prevent the wet-etch chemical from penetrating into the interlayer insulating film 31 through an interfacial surface formed between the storage electrode and the etching barrier layer 34 during the following wet etching process. The first blocking layer 37 is made from a material having an etching selectivity lower than that of the mold insulating layer 35 with respect to the wet-etch chemical. In detail, the first blocking layer 37 is made from a material having an etching rate lower than that of the mold insulating layer 35 with respect to the HF solution or BOE solution. For instance, the first blocking layer 37 is made from a dielectric layer having a high dielectric constant and a thickness of about 10 to 100 Å and is selected from the group consisting of $Al_2O_3$, $HfO_2$, $TiO_2$, $Ta_2O_5$, $ZrO_2$ and $La_2O_3$ layers.

Figure 3B:
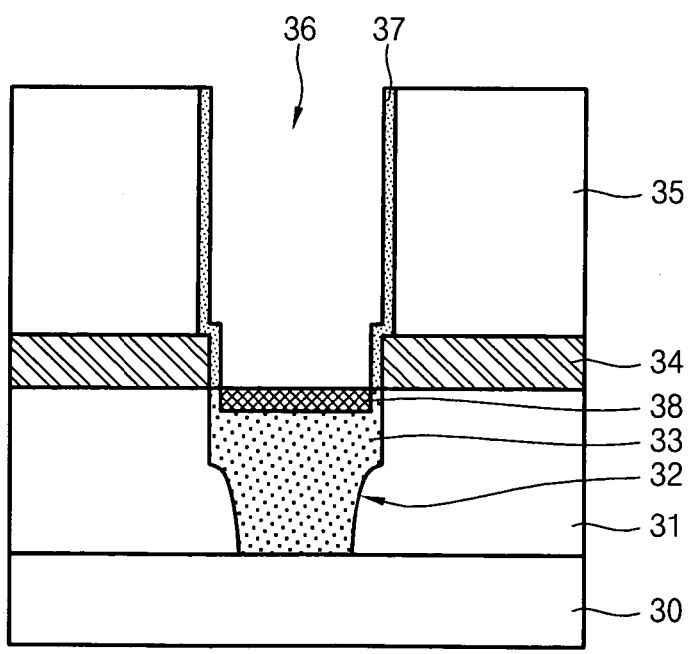

Referring to FIG. 3B, parts formed on the mold insulating layer 35 and the contact plug 33 are removed by etching back the first blocking layer 37, thereby exposing the contact plug 33. After that, in order to form an ohmic contact between the polysilicon contact plug 33 and the metal storage electrode, a transition metal layer, for example, a Ti layer (not shown) is deposited on the resultant structure including the exposed contact plug 33 and then a rapid heat treatment process is carried out with respect to the resultant structure, thereby forming an ohmic contact layer 38 made from $TiSi_2$ on a surface of the contact plug 33. After that, non-reacted portions of the Ti layer are removed through typical processes generally known in the art.

Figure 3C:
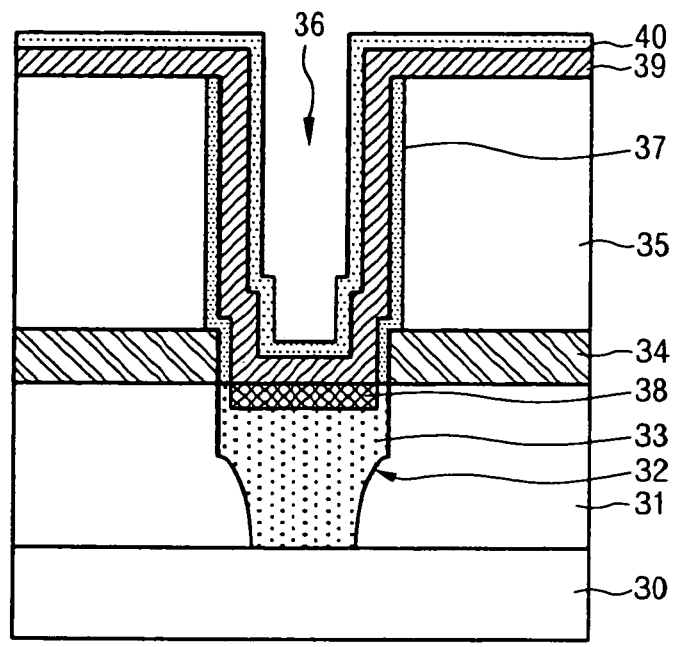

Referring to FIG. 3C, a first metal layer 39 including a TiN layer or a Ru layer for the storage electrode is deposited on the first blocking layer 37 including the ohmic contact layer 38 made from $TiSi_2$ and the mold insulating layer 35. Then, a second blocking layer 40 is formed on the first metal layer 39 in order to prevent the wet-etch chemical from penetrating into the interlayer insulating film 31 through the storage electrode during the following wet etching process. Similarly to the first blocking layer 37, the second blocking layer 40 is made from a material having an etching rate lower than that of the mold insulating layer 35 with respect to the HF solution or BOE solution. For instance, the second blocking layer 40 is made from a dielectric layer having a high dielectric constant and a thickness of about 10 to 200 Å and is selected from the group consisting of $Al_2O_3$, $HfO_2$, $TiO_2$, $Ta_2O_5$, $ZrO_2$ and $La_2O_3$ layers.

Figure 3D:
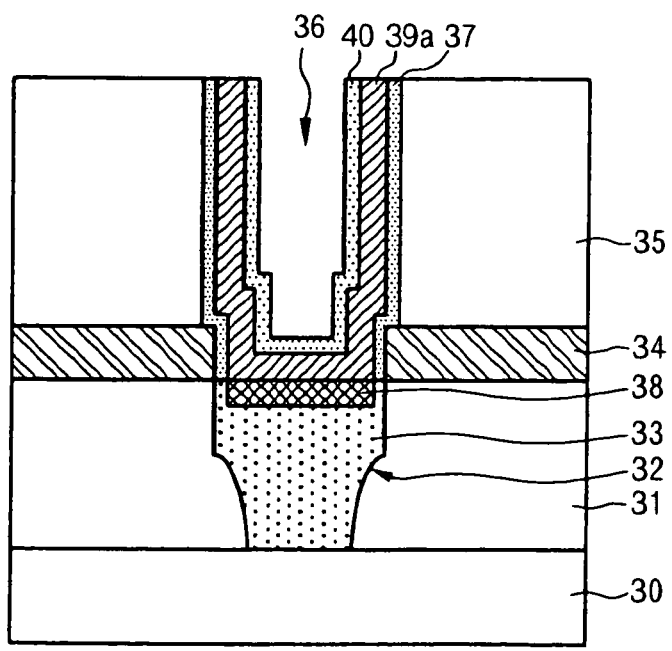

Referring to FIG. 3D, a passivation layer (not shown) is formed on the second blocking layer 40 in order to use the passivation layer as an etching barrier in the following CMP or etch back process. After that, the CMP or etch back process is performed with respect to the passivation layer and predetermined portions of the second blocking layer 40 and the first metal layer 39 formed on the mold insulating layer 35, thereby forming storage electrodes 39a such that adjacent storage electrodes 39a are spaced apart from each other. Thereafter, the passivation layer remaining in the hole 36 is removed through typical processes generally known in the art.

Figure 3E:
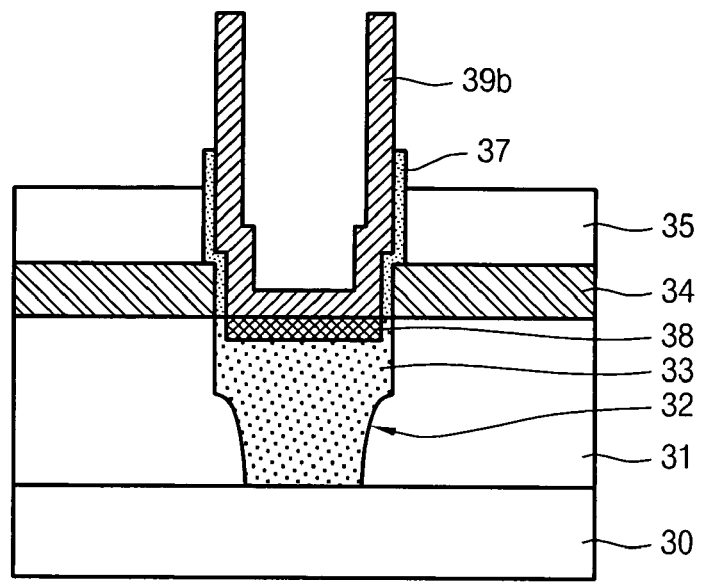
Figure 3F:
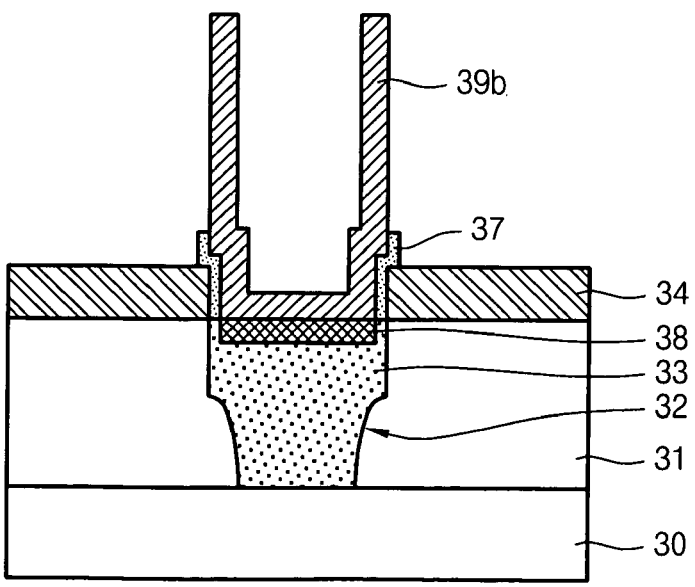

Referring to FIGS. 3E and 3F, a wet etching process is performed with respect to the resultant substrate by using the diluted HF or BOE solution, thereby removing the mold insulating layer and achieving the cylinder type storage electrode 39b.

FIG. 3E is a sectional view illustrating a status just before a main etching process for removing the mold insulating layer has been completed and FIG. 3F is a sectional view illustrating a status after an over etching of about 10 to 20% has been performed after the main etching process.

As shown in FIG. 3E, the second blocking layer 40 is removed just before completing the main etching process, but predetermined portions of the first blocking layer 37 may remain on an outer surface of the cylinder type storage electrode 39b. As shown in FIG. 3F, only a part of the first blocking layer 37 may remain between the cylinder type storage electrode 39b and the etching barrier layer 34 after the over etching process has been performed.

Therefore, as mentioned above, since the first and second blocking layers 37 and 40 made from dielectric layers having the high dielectric constant represent the wet etching rate lower than that of the mold insulating layer 35 made from an oxide layer with respect to the wet-etch chemical such as the HF solution or the BOE solution, it is possible to prevent the wet-etch chemical from penetrating into the interlayer insulating film 31 through the storage electrode 39b made from a TiN layer or a Ru layer, or through the interfacial surface formed between the storage electrode 39a and the etching barrier layer 34. Accordingly, the present invention can prevent the contact plug 33 including the $TiSi_2$ layer 38 and the interlayer insulating film 31 aligned below the storage electrode 39a from being damaged or broken, thereby improving the yield rate and reliability of the semiconductor devices.

Figure 3G:
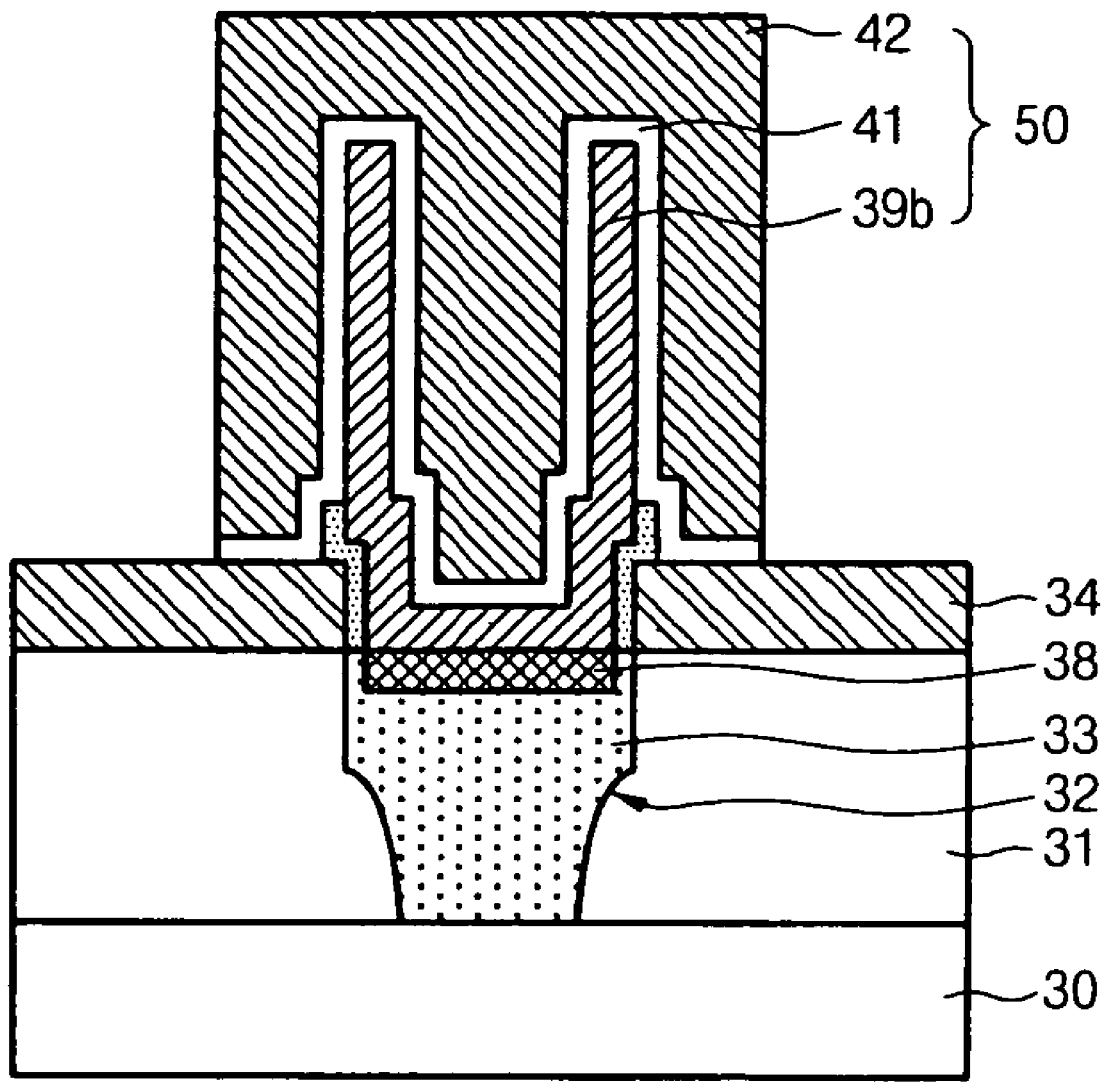

Referring to FIG. 3G, a $HfO_2$ layer is deposited on the cylinder type storage electrode 39b with a thickness of about 10 to 50 Å by repeatedly performing an ALD (atomic layer deposition) process in the deposition cycle of "source gas flow, purge, reaction gas flow and purge" until a desire thickness is obtained. Then, the $M_xO_y$ layer having the dielectric constant higher than that of $Al_2O_3$ and selected from the group consisting of $TiO_2$, $Ta_2O_5$, $ZrO_2$ and $La_2O_3$ layers is formed on the $HfO_2$ layer with a thickness of about 10 to 100 Å, thereby forming a dielectric layer 41 in the form of a dual layer including $M_xO_y$ and $HfO_2$ layers.

Herein, when depositing the $HfO_2$ layer through the ALD process, C16H36HfO4 is used as a source gas for Hf and organic metal compound containing Hf (for instance, TEDAHf or TEMAHf) is used as a precursor. At this time, a flow rate of the source gas is about 50 to 500 sccm. In addition, one selected from the group consisting of $O_3$ (density: 200±20 g/m$^3$), $O_2$, $N_2O$, plasma $N_2O$, and $H_2O$ is used as a reaction gas, in which a flow rate of the reaction gas is about 0.1 to 1 slm.

When depositing the $M_xO_y$ layer selected from the group consisting of $TiO_2$, $Ta_2O_5$, $ZrO_2$ and $La_2O_3$ layers through the ALD process, in a case of the $TiO_2$ layer, $Ti[OCH(CH_3)_2]_4$ is used as a source gas for Ti and organic metal compound containing Ti is used as a precursor. In a case of the $Ta_2O_5$ layer, $Ta(OC_2H_5)$ or $Ta(N(CH_3)_2)_5$ is used as a source gas for Ta. In addition, in a case of the $ZrO_2$ layer, $Zr[N(CH_3)C_2H_5]_4$ or $ZrCl_4$ is used as a source gas for Zr and organic metal compound containing Zr is used as a precursor. In a case of the $La_2O_3$ layer, $La[(CH_3)_2CH—CH_3CONH_2]$, $La(CH_3)_3$ or $La(C_2H_5)_3$ is used as a source gas for La and organic metal compound containing La is used as a precursor. In addition, one selected from the group consisting of $O_3$ (density: 200±20 g/m$^3$), $O_2$, $N_2O$, plasma $N_2O$, and $H_2O$ is used as a reaction gas when depositing the $TiO_2$, $Ta_2O_5$, $ZrO_2$ and $La_2O_3$ layers.

After that, a second metal layer including the TiN layer or the Ru layer is deposited on the dielectric layer 41 with a thickness of about 100 to 500 Å through the CVD process, thereby forming a plate electrode 42. As a result, a cylinder type capacitor 50 having an MIM structure according to the present invention can be achieved.

As described above, the capacitor 50 according to the present invention has a cylindrical structure and employs the dual layer of $M_xO_y/HfO_2$ having the dielectric constant higher than that of $HfO_2/Al_2O_3$ or $HfO_2/Al_2O_3/HfO_2$, so that the capacitor may have sufficient cell capacitance of above 25fF/cell even in a 60 nm level.

In the meantime, if the plate electrode 42 is made from the TiN layer, a W-layer or a WN-layer having low resistance can be deposited on the TiN layer with a thickness of about 100 to 500 Å in order to reduce resistance of the TiN layer.

In addition, after the cylinder type capacitor 50 according to the present invention has been fabricated, a dielectric layer, such as $Al_2O_3$, $HfO_2$, $TiO_2$, $Ta_2O_5$, $ZrO_2$ or $La_2O_3$ layer, or a metal layer, such as a TiN layer, can be further deposited on the cylinder type capacitor 50 with a thickness of about 50 to 200 Å through the ADL process in order to provide a protective layer capable of ensuring structural stability of the capacitor 50 against humidity, temperature and electric impact during the following processes, such as a back-end process, a thermal curing process, a wet process, a packaging process and reliability test process.

As described above, according to the present invention, the first and second blocking layers made from materials having the wet etching rate lower than that of the mold insulating layer are formed before/after the storage electrode material is deposited, so that it is possible to prevent the wet-etch chemical from penetrating into the interlayer insulating film through the storage electrode or through the interfacial surface formed between the storage electrode and the etching barrier layer by means of the first and second blocking layers. Therefore, the present invention can prevent the wet-etch chemical from flowing below the storage electrode, thereby protecting the contact plug and the interlayer insulating film aligned below the storage electrode. Thus, the yield rate and reliability of the semiconductor devices including the capacitor can be improved.

In addition, the capacitor according to the present invention has a cylindrical structure and employs the dual layer of $M_xO_y/HfO_2$ having the dielectric constant higher than that of $HfO_2/Al_2O_3$ or $HfO_2/Al_2O_3/HfO_2$, so that the capacitor may have cell sufficient capacitance of above 25 fF/cell even in a 60 nm level. Thus, mass storage DRAMs can be realized.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method of forming a capacitor of a semiconductor device having a semiconductor substrate on which a layer comprising a contact plug and a interlayer insulating film adjoining the contact plug is formed, the method comprising the steps of:
   i) forming an etching barrier layer on the layer having the interlayer insulating film and the contact plug, and then forming a mold insulating layer on the etching barrier layer;
   ii) forming a hole having a sidewall exposing the contact plug by etching the mold insulating layer and the etching barrier layer;
   iii) forming a first blocking layer on the sidewall of the hole, the first blocking layer being made from a material having a wet etching rate lower than the wet etching rate of the mold insulating layer;
   iv) forming a metal layer for a storage electrode on surfaces of the first blocking layer and the mold insulating layer and then forming a second blocking layer made from a material identical to that of the first blocking layer on the metal layer;
   v) removing predetermined portions of the second blocking layer and the metal layer formed on or above the mold insulating layer;
   vi) forming a storage electrode by removing the mold insulating layer through a wet etching process;
   vii) forming a dielectric layer on the storage electrode; and
   viii) forming a plate electrode on the dielectric layer.

2. The method of claim 1, wherein the etching barrier layer is made of silicon nitride.

3. The method of claim 1, wherein the mold insulating layer is an oxide layer made from one of TEOS, PSG, BPSG and USG or a stacked layer made from one or more of TEOS, PSG, BPSG, and USG.

4. The method of claim 1, wherein the etching barrier layer is used as an etch stop layer in the wet etching process for removing the mold insulating layer, and wherein the etching barrier layer is etched with an over etching target in a range of 10 to 100%.

5. The method of claim 1, wherein either one of the first and second blocking layers is a dielectric layer made from one of $Al_2O_3$, $HfO_2$, $TiO_2$, $Ta_2O_5$, $ZrO_2$, and $La_2O_3$.

6. The method of claim 1, wherein the first blocking layer has a thickness of about 10 to 100 Å.

7. The method of claim 1, wherein the second blocking layer has a thickness of about 10 to 200 Å.

8. The method of claim 1, further comprising a step of forming a metal silicide layer on a surface of the contact plug after forming the first blocking layer but before forming the second blocking layer.

9. The method of claim 1, wherein the wet etching process for the mold insulating layer is performed by using a HF solution or a BOE solution.

10. The method of claim 1, wherein a part of the first blocking layer remains between the etching barrier layer and the storage electrode when the mold insulating layer is wet-etched.

11. The method of claim 1, wherein the second blocking layer is completely removed when the mold insulating layer is wet-etched.

12. The method of claim 1, wherein the dielectric layer is stacked layers of an $HfO_2$ layer and an $M_xO_y$ layer formed on the $HfO_2$ layer, and wherein the $M_xO_y$ layer is made from one of $TiO_2$, $Ta_2O_5$, $ZrO_2$, and $La_2O_3$.

13. The method of claim 12, wherein the $HfO_2$ layer has a thickness of about 10 to 50 Å.

14. The method of claim 12, wherein the $M_xO_y$ layer has a thickness of about 10 to 100 Å.

15. The method of claim 12, wherein the $HfO_2$ layer and the $M_xO_y$ layer are formed through repeatedly performing an atomic layer deposition (ALD) process in a deposition cycle of source gas flow, purge, reaction gas flow, and purge until a desire thickness is obtained.

16. The method of claim 1, wherein the plate electrode includes a TiN layer or a Ru layer.

17. The method of claim 1, wherein the plate electrode is made of a TiN layer and either a W-layer or a WN-layer deposited formed on the TiN layer.

18. The method of claim 1, further comprising a step of forming a protective layer after forming the plate electrode for ensuring structural stability of the capacitor.

19. The method of claim 18, wherein the protective layer is a dielectric layer made from one of $Al_2O_3$, $HfO_2$, $TiO_2$, $Ta_2O_5$, $ZrO_2$ and $La_2O_3$.

20. The method of claim 19, wherein the protective layer is made from TiN.

* * * * *